(12) United States Patent
Leib

(10) Patent No.: US 8,309,384 B2
(45) Date of Patent: Nov. 13, 2012

(54) PROCESS FOR PACKAGING COMPONENTS, AND PACKAGED COMPONENTS

(75) Inventor: Juergen Leib, Freisingen (DE)

(73) Assignee: Wafer-Level Packaging Portfolio LLC, Cupertino, CA (US)

( * ) Notice: Subject to any disclaimer, the term of this patent is extended or adjusted under 35 U.S.C. 154(b) by 187 days.

(21) Appl. No.: 12/753,514

(22) Filed: Apr. 2, 2010

(65) Prior Publication Data

US 2010/0187669 A1 Jul. 29, 2010

Related U.S. Application Data

(63) Continuation of application No. 10/580,284, filed as application No. PCT/EP2004/012917 on Nov. 15, 2004, now Pat. No. 7,700,397.

(30) Foreign Application Priority Data

Dec. 3, 2003 (DE) .................................. 103 56 885

(51) Int. Cl.
*H01L 23/045* (2006.01)

(52) U.S. Cl. ..... 438/51; 438/118; 438/125; 257/E21.597

(58) Field of Classification Search ................... 438/51, 438/118, 125, FOR. 369; 257/E23.009, E23.011, 257/E23.02, E23.067, E21.505
See application file for complete search history.

(56) References Cited

U.S. PATENT DOCUMENTS

| 5,107,329 | A | 4/1992 | Okinaga et al. |
| 5,315,486 | A * | 5/1994 | Fillion et al. .................. 361/795 |
| 5,438,478 | A | 8/1995 | Kondo et al. |
| 5,635,762 | A | 6/1997 | Gamand |
| 5,731,231 | A | 3/1998 | Miyajima |
| 5,777,391 | A | 7/1998 | Nakamura et al. |
| 5,840,593 | A | 11/1998 | Leedy |
| 6,075,712 | A * | 6/2000 | McMahon .................... 361/783 |
| 6,171,888 | B1 | 1/2001 | Lynch et al. |
| 6,355,981 | B1 | 3/2002 | Richards et al. |
| 6,476,463 | B1 | 11/2002 | Kaneko et al. |

(Continued)

FOREIGN PATENT DOCUMENTS

EP 1408547 4/2004

(Continued)

OTHER PUBLICATIONS

Japan Application No. 2006-541821, Office Action, Aug. 11, 2010.

(Continued)

*Primary Examiner* — George Fourson, III
(74) *Attorney, Agent, or Firm* — Edward P. Heller, III

(57) ABSTRACT

A wafer level packaging process for packaging components is provided. The process includes permanently connecting a functional side of a base substrate to a covering substrate at wafer level so that a plurality of functional regions on the functional side are in each case packaged to form a wafer level package, the plurality of functional regions being spaced apart from one another on the functional side; producing contact-connection recesses in the base substrate to uncover contact surfaces on the base substrate from a back surface of the base substrate; dividing the base substrate into body regions and connection regions; thinning the body regions or the connection regions until the wafer level package has different thicknesses in the body regions and the connection regions; and dicing wafer level package into chips along predefined cutting lines between the plurality of functional regions.

6 Claims, 6 Drawing Sheets

U.S. PATENT DOCUMENTS

| | | |
|---|---|---|
| 6,521,981 B2 | 2/2003 | Miyazaki et al. |
| 6,559,530 B2 * | 5/2003 | Hinzel et al. .................. 257/684 |
| 6,670,215 B2 | 12/2003 | Miyazaki et al. |
| 6,777,263 B1 | 8/2004 | Gan et al. |
| 6,784,020 B2 | 8/2004 | Lee et al. |
| 6,806,557 B2 * | 10/2004 | Ding ............................ 257/659 |
| 6,876,048 B2 * | 4/2005 | Fischer et al. ................. 257/417 |
| 7,098,072 B2 * | 8/2006 | Garyainov et al. ........... 438/107 |
| 2004/0140573 A1 | 7/2004 | Pu et al. |

FOREIGN PATENT DOCUMENTS

| | | |
|---|---|---|
| EP | 1482552 | 12/2004 |
| JP | 06244437 A | 9/1994 |
| JP | 2007-513507 A | 5/2007 |
| WO | WO96/16443 A1 | 5/1996 |
| WO | WO98/52225 A1 | 11/1998 |
| WO | WO99/40624 | 8/1999 |
| WO | WO99/40624 A1 | 8/1999 |
| WO | WO03/019653 | 3/2003 |
| WO | WO2005/055310 A2 | 6/2005 |
| WO | WO2005/055310 A3 | 6/2005 |

OTHER PUBLICATIONS

International Application No. PCT/EP2004/012917, International Preliminary Report on Patentability, Mar. 7, 2006.

* cited by examiner

PROCESS FOR PACKAGING COMPONENTS, AND PACKAGED COMPONENTS

CROSS REFERENCE TO RELATED APPLICATIONS

This application is a continuation of application Ser. No. 10/580,284 filed Jun. 25, 2007 now U.S. Pat. No. 7,770,397, which is a national stage entry of International Application No. PCT/EP2004/012917, which was filed on Nov. 15, 2004, which claims the benefit of German Patent Application No. DE10356885.9, which was filed on Dec. 3, 2003, the entire contents of all of which are incorporated herein by reference.

BACKGROUND OF THE INVENTION

1. Field of the Invention

The invention relates to a process for packaging components and to a component packaged in this way in general, and to a wafer level packaging process and a component packaged in this way in particular.

2. Description of Related Art

For many technical applications, there is a need for hermetically packaged chips, since it is in this way possible, for example, to protect the sensitive integrated circuits on a semiconductor substrate. However, the packaging is at least equally important for optical or micro-mechanical components.

There are known processes in which the chips are first of all divided from the wafer assembly and then packaged individually. This is an extremely complex process which is scarcely suitable for the mass production of sensitive components. In particular, the integrated circuits or other components are not (yet) protected when they are being divided from the wafer, and consequently they can become soiled and/or be destroyed during the sawing operation.

There are also known processes in which the components are first of all packaged at wafer level and then divided. These processes are known as wafer level packaging (WLP).

The prior art disclosed a number of such processes.

However, with wafer level packaging it is difficult to contact-connect the integrated circuits, since any connection contacts are typically covered by a covering substrate. This will be illustrated on the basis of the process described below.

The known processes generally work on the assumption that the connections to the contact regions on the chips or at the integrated circuits can be produced directly, as can be achieved without problems, for example, in the case of memory chips.

However, this takes no account of the fact that, for example in the case of chips with an integrated sensor or optical component, the optically active surface in the mounted state, for example on a printed circuit board, has to remain uncovered.

In this respect, WO 99/40624 has disclosed a process in which it is attempted to eliminate the problems outlined above by the connection contacts which are present at the active component being routed from the active side onto the opposite underside of the wafer or chip. The further contact-connection of the connection contacts routed downwards can then be carried out in a known way.

Moreover, a similar process is described in "Wafer Level Chip Scale Packaging: Benefits for Integrated Passive Devices", Clearfield, H. M.; Young, J. L.; Wijeyesekera, S. D.; Logan, E. A.; IEEE Transactions on Advanced Packaging, Vol. 23, No. 2, pages 247-251.

The abovementioned process is distinguished by the fact that, after a glass covering has been applied to the optically active front surface of a wafer, trenches which divide the wafer into individual chip regions are produced along the underside of the wafer. During the production of the trenches, the connection contact locations located on the active side of the wafer, in each case on the transition region between two chips, are divided and thereby uncovered in the trenches. To completely package the wafer or chips, after the trenches have been produced, a piece of glass is adhesively bonded over the trenches and is then cut into in a suitable way such that the trenches in the wafer and the connection contact locations are once again freely accessible. This is followed by deposition of contact tracks in the trenches which have been produced, which is intended to effect contact-connection of the connection contact locations and to lay the contact location onto the back surface of the packaged chip.

Although the proposed process leads to what is known as through-contacting of the connection contacts from the active front surface of the chip or wafer to the passive back surface, this gives rise to a number of significant drawbacks, making chips which have been produced using the process under discussion disproportionately expensive.

One reason for this is the fact that the trenches which are to be produced in the known process are significantly wider than those which would be considered standard for normal dicing of a wafer. The result of this is that the distances between the chips or the integrated circuits have to be relatively great, and consequently there is space for fewer chips on a wafer.

If only for this reason, the known process already gives a relatively low chip yield from a semiconductor wafer. Furthermore, the proposed production process is also relatively slow. This is related in particular to the fact that the trenches have to be ground in sequentially and also that what is known as the dicing saw can only operate at a relatively slow advance rate during production of the trenches. Apart from all this, the wear to the saw blades is also high. The dicing saws which have to be used, for this reason and on account of the high demands imposed on the dimensional accuracy of the mechanical process described and also the considerable machine costs, are very expensive.

One significant problem of the process described in WO 99/40624 is also that the uncovering of the connection contacts when grinding the trenches is effected by a dicing operation. Dicing of the connection contacts of this type, as has been mentioned above, requires an extremely high dimensional accuracy, since otherwise at least part of the contact can be destroyed. However, even if accurate cutting of the connection contact is achieved, it is not easy to produce a contact connection using the connection contacts which have been uncovered in this way. The reasons for this are in particular that the contact-connection according to the prior art is to be effected by deposition of contact tracks on the oblique walls of the trenches in the wafer, but uniform and therefore targeted deposition is only possible at a steep to perpendicular angle to the deposition direction.

When sawing along the contacts, a further particular drawback is that a number of interfaces are at least temporarily uncovered, which can lead to corrosion and diffusion and can therefore have a significant adverse effect on the service life of the components.

Further processes for the through-contacting of chips are also described in "Future Systems-on-Silicon LSI Chips", Koyanagi, M; Kurino, H; Lee, K. W.; Sakuma, K., IEEE Micro, July-August 1998, pages 17-22, WO 98/52225 and DE 197 46 641. However, these processes are not suitable for the packaging of, for example, optical chips.

A further improved wafer level packaging process is known from WO 03/019653 A2, which is hereby incorporated in its entirety by reference in the subject matter of the present disclosure.

In the process described in that document, the contacts, after packaging, are made accessible again through passages through which the contacts are then contact-connected, for example by means of what are known as ball grid arrays. The drawbacks described above can be substantially avoided in this process.

Nevertheless, under certain circumstances a problem may be presented by the fact that the ball grid arrays generally contain a lead-tin solder, the melting point of which is approximately 230° C., and consequently the thermal stability of a chip produced in this way is insufficient for certain applications, or sensitive components are subject to excessive thermal loading during mounting. Furthermore, thermomechanical coupling between the connections with ball grid array and the semiconductor components can lead to problems in sensitive components.

In any case, under certain circumstances it is desirable to be able to make do without lead-containing solder.

Furthermore, it is desirable for the efficiency and yield of the processes described to be improved further and for the range of applications for the chips produced to be widened.

BRIEF SUMMARY OF THE INVENTION

Therefore, the invention is based on the object of providing a process of the generic type which works efficiently and inexpensively.

A further object of the invention is to provide a process which ensures a high yield and is in particular also suitable for optical and/or micro-mechanical components.

Yet another object of the invention is to provide a process and a component which achieve improved thermomechanical decoupling of the connections from the functional regions.

Yet another object of the invention is to provide inexpensive and temperature-resistant components of a high quality and stability.

Yet another object of the invention is to provide a process and a component which avoid or at least alleviate the drawbacks of the prior art.

According to the invention, components undergo wafer level packaging and contact connection in the following way.

A base substrate, which has a functional side and a back surface on the opposite side from the functional side, is permanently joined, by means of the functional side, to a covering substrate at wafer level. The functional side is characterized in that a multiplicity of functional regions spaced apart from one another are arranged thereon. More specifically, there is one functional region per chip or die that is to be produced. A functional region is to be understood as meaning a region having functional elements, e.g. integrated circuits or other electronic, optical, electro-optical, micro-mechanical, micro-opto-mechanical or similar components.

For example, the functional region may, therefore, comprise an optical sensor. Also by way of example, the base substrate is, for example, a silicon semiconductor wafer with integrated circuits. However, other materials are also possible for the base substrate, such as for example gallium arsenide or indium phosphide.

The functional regions are now in each case encapsulated in a hermetically or quasi-hermetically sealed manner by the joining of the two substrates. One possible joining technique is adhesive bonding, for example using epoxy, but anodic bonding is also possible. For anodic bonding, it may be advantageous for a bonding layer (bond layer), e.g. in the form of a layer of evaporation-coating glass, to be applied to at least one of the two substrates prior to joining. A bonding layer created in this way can also be used for direct bonding.

With regard to joining using epoxy, it should also be noted that this only achieves a limited hermetic seal. Therefore, in the context of the present description, a join of this nature is referred to as quasi-hermetic.

Furthermore, the base substrate has contact surfaces (known as contact pads) on its functional side, and these contact surfaces, after the substrates have been joined, are uncovered from a back surface of the base substrate, this back surface being on the opposite side from the functional side. For this purpose, contact-connection recesses are produced in the base substrate above the contact surfaces, in particular by etching. The contact-connection recesses are also known to the person skilled in the art as vias for making through-contact through the base substrate.

At a further subsequent stage, the wafer assembly formed at least from base substrate and covering substrate is diced into the chips or dies, in particular by sawing, along predefined cutting lines between the functional regions. If a suitable passivation is used, such as for example a patternable evaporation-coating glass layer with a thickness of preferably 0.01 µm to 100 µm, typically 8 µm, individual chips which are in each case packaged in a hermetically or quasi-hermetically sealed manner are formed. This encapsulation process which works at wafer level is much more efficient than individual encapsulation.

At a further, later stage, the component has a body region and connection regions, the connection regions being adjacent to the contact-connection recesses, and the component, in particular the base substrate, being thinned either in the body region or in the connection regions until different thicknesses have been reached in the connection regions and the body regions.

In other words, the base substrate is divided into body regions and connection regions, with the body regions in each case extending laterally over the functional regions and forming part of the respective package for the subsequent chip. The connection regions laterally adjoin the contact-connection recesses or vias. The particular feature now is that the base substrate is thinned to a greater extent in the connection regions than in the body regions, or vice versa.

This advantageously increases the space for contact-connection. Furthermore, the process according to the invention creates excellent thermo-mechanical decoupling between the connections and the functional region.

If appropriate, the base substrate is thinned down to a thickness of zero, i.e. is removed altogether.

At a further, subsequent stage, the chips are preferably inserted into a circuit carrier and the contact surfaces or contact redistribution elements, which are electrically conductively connected to the contact surfaces, are connected to corresponding contact elements of the circuit carrier by means of wire bonding on the back surface of the base substrate. Consequently, the etched-clear contact surfaces or the contact redistribution elements are in particular only contact-connected in the state in which the individual components have been diced.

In the case of wire bonding, electrically conductive, thin, substantially round wires, for example of aluminium or gold, are welded to the contact surfaces without the use of solder. For this purpose, the wire is preferably introduced into a ram and pressed onto the contact surfaces under the action of force. The actual welding is preferably carried out cold and/or by means of ultrasound. This process is distinguished in particular by its reliability and the quality of the connection which is created. However, the application of ball grid arrays as contact elements for the contact connection of the contact surfaces or contact redistribution elements is also within the scope of the invention.

A further advantage of wire bonding is that this represents a very simple and inexpensive process and, furthermore, is more thermally stable than connections produced by means of solder balls or what are known as ball grid arrays formed from solder. Also, there is scarcely any thermal loading on the components during the wire bonding.

A further particular benefit of the invention is that the contact connection, in particular the wire bonding, is carried out on the back surface, so that the process, by way of example, can also be used for optical components with a transparent covering substrate, in particular made from glass. Of course, the process is not restricted to this, but rather the covering substrate may also consist of another material, such as metal or a semiconductor, depending on the particular application area. At any rate, it has been found that back-surface contact connection using the process according to the invention can be carried out in a simple and efficient way.

A further advantage is that the process produces particularly little dust. In particular, the under certain circumstances very sensitive functional regions are protected as early as by the first process step as a result of the application of the covering substrate.

It is optionally possible for enlargement elements, known as contact pad extensions, to be applied to the contact surfaces on the base substrate on the functional side before the base substrate is joined to the covering substrate. This increases the contact surface area and facilitates access using the bonding ram. In this case, the contact-connection recesses may if appropriate extend over the enlargement elements.

It is preferable for the base substrate to be thinned uniformly after it has been joined to the covering substrate, for example by mechanical grinding and/or etching, in order to reach a reduced component thickness.

The uncovering of the contact surfaces is carried out in particular by means of patterned etching of the base substrate, e.g. by means of a lithography process. Furthermore, etching can be carried out by wet-chemical means or by means of a plasma technique. Processes of this type are fundamentally known to the person skilled in the art.

Furthermore, it is advantageous for a passivation layer to be applied to the back surface of the base substrate. The passivation layer is in particular patterned, with the contact surfaces being substantially uncovered. This can be achieved either by the passivation layer being applied in ready-patterned form, e.g. using a mask, or by the passivation layer being applied uniformly to the back surface of the base substrate and then being patterned.

This has the advantage that the base substrate, and in particular the interfaces with the covering substrate and the silicon oxide layer which is present on the functional side in the case of silicon semiconductor substrates, are protected from environmental influences, such as for example oxidation. Moreover, the silicon oxide layer can be used as an etching stop mask when etching the contact-connection recesses or contact-connection passages, but is then opened up on the back surface over the contact surface.

A suitable passivation layer is in particular a layer of glass applied by evaporation coating or a photographically patternable plastic layer, e.g. BCB. The passivation layer preferably extends as far as the edge region of the contact surfaces. Furthermore, still further passivation layers can be provided if required.

According to a particular embodiment, the contact surfaces and/or the contact redistribution elements, after they have been uncovered, are covered on the back surface with a metal layer, e.g. a layer of gold, by electroplating or electroless means. This improves the surface quality of the contact surfaces, so that the reliability of the wire bonding can be improved further.

Furthermore, it is advantageous for the base substrate to be etched on the back surface along the predefined cutting lines, so as to define trenches or what are known as sawing streets, which extend along both sides of the cutting lines and along which the wafer is sawn into the chips.

Furthermore, the thinning of the base substrate in the connection regions is carried out in particular before the contact surfaces have been joined to the contact elements of the circuit carrier by means of wire bonding.

This results in the advantage of more space being created to enable the wire bonding to be carried out from the back surface using the bonding ram. This is because the openings that are present in known processes are typically so small that the wire bonding would at least be made more difficult if not altogether impossible.

According to a particularly simple embodiment, the contact-connection recesses or vias, the connection regions and/or the sawing streets are produced in a single step. This allows the process to be simplified still further.

It is preferable for the base substrate first of all to be thinned uniformly in a first step, for example by grinding, and then to be thinned still further in the connection regions or the body regions, e.g. by means of photolithographic patterned etching, in a second step which follows the first step, so that it becomes thinner in these regions than in the respective other regions, so that in addition to the contact-connection recesses further regions having a different thickness, in particular a lower thickness, of the base substrate than that produced by uniform thinning are produced.

In this context, the term thinning of the base substrate is fundamentally also to be understood as encompassing thinning down to a thickness of zero, i.e. complete removal in the corresponding region. However, it is also possible to produce at least three different thickness regions in the body region, connection region and at the contact-connection recess.

If the base substrate is thinned down to a thickness of zero in the connection regions, it is advantageous that the contact-connection of the connections can be particularly successfully mechanically decoupled from the functional region. Therefore, when connecting the connections or connection wires, e.g. by means of wire bonding, no stress or only very little stress is transmitted to the functional region. This inter alia makes it possible to avoid an increased dark current in sensitive image sensors.

However, even if solder balls are used as contact element, the location of contact between the solder balls and the component is thermomechanically decoupled from the functional region, so that the mechanical stress during the thermal cycles encountered in use is not transmitted or is scarcely transmitted to the functional region.

Furthermore, it is particularly preferred to produce connection strips which extend parallel, in elongate form, to the predefined cutting lines. The base substrate is once again thinned to a greater extent in the connection strips than in the body regions. The advantage in this context is that there is no need to create a dedicated connection region for each contact-connection recess, but rather a plurality of contact-connection recesses adjoin the same connection strip. In particular, the connection strip extends substantially from one cutting line to the next, in particular over the entire wafer, so that a pattern of strips is produced over the wafer.

It is preferable for the connection regions to be produced in such a manner that they extend at least from the contact-connection recesses to the sawing streets or the predefined cutting lines. In other words, the sawing streets and the connection regions can form a single region, so that in particular the base substrate is completely removed between contact surfaces of adjacent chips. This makes it possible to save further working steps.

The process according to the invention is also particularly suitable for components having a functional region enclosed in a cavity, e.g. an MEMS or MOEMS component. In particular for this purpose, before the base substrate is joined to the covering substrate, the covering substrate is provided with recesses over the functional regions, so that after the base substrate has been joined to the covering substrate, cavities in which the functional regions are then enclosed are formed between these two substrates.

In addition to the process, a further subject matter of the invention is also the component producible by the process as a chip after the dicing operation, the intermediate product at wafer level prior to dicing and a circuit arrangement having a circuit carrier and the diced component which is installed therein and electrically connected to it by means of wire bonding.

The diced, packaged component, which is in particular an electronic, optical, electro-optical, micro-electro-mechanical or micro-opto-electro-mechanical component, accordingly comprises according to the invention: a base substrate having a functional side, on which a functional region of the component is arranged, and a back surface on the opposite side from the functional side, a covering substrate, which is permanently joined to the base substrate on the functional side of the latter, the covering substrate extending over the functional region, and the join between the base substrate and the covering substrate, or the joining layer, surrounding the functional region in such a manner that a hermetically or quasi-hermetically sealed housing is formed around the functional region, and contact surfaces on the base substrate, which are electrically connected to the functional region in particular through the housing.

Furthermore, the base substrate comprises, in the region of the contact surfaces, contact-connection recesses through which the contact surfaces are or can be contact-connected from outside the housing and from the back surface of the base substrate or through the base substrate, the base substrate being divided into a body region and connection regions, the body region extending laterally over the functional region and forming part of the housing, and the connection regions being laterally offset with respect to the contact-connection recesses, in particular adjoining the latter, and the component, in particular the base substrate, having different thicknesses in the body region and the connection regions, or the base substrate being thinned to a greater extent in the body region or the connection regions, in particular, if appropriate, being removed altogether.

Furthermore, after dicing, the component has narrow sides at which it is separated out of the wafer assembly, and in this respect the connection regions extend at least from the contact-connection recesses to the narrow sides.

Otherwise, reference is also made to the process features.

In the text which follows, the invention is explained in more detail on the basis of exemplary embodiments and with reference to the drawings, in which identical and similar elements are in some cases provided with identical reference symbols and the features of the various exemplary embodiments can be combined with one another.

DETAILED DESCRIPTION OF THE INVENTION

Figure 1:
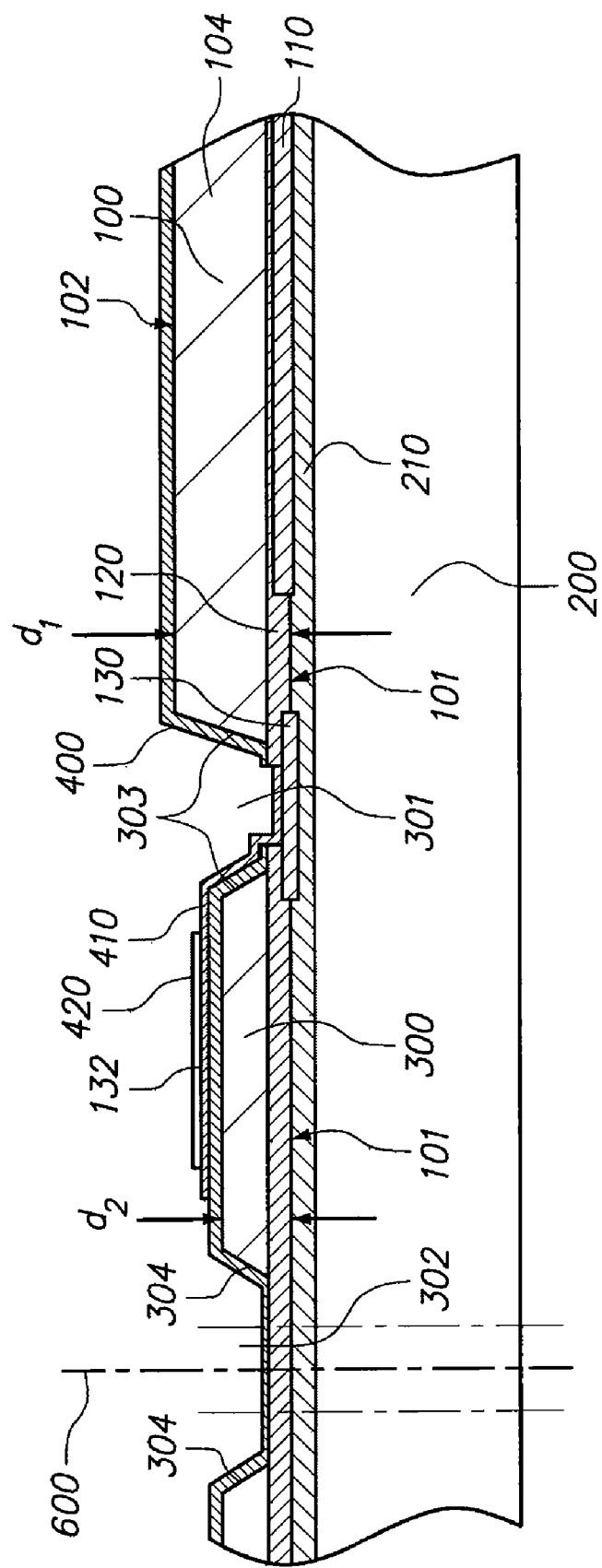
FIG. 1 shows a diagrammatic cross section through an excerpt from an embodiment of the component according to the invention at wafer level.

FIG. 1 shows a base substrate after processing, i.e. provided with functional regions, in this example integrated circuits 110. In this example, the base substrate is represented by a silicon semiconductor wafer 100.

Furthermore, in the case of CMOS applications or SOI circuits, the semiconductor wafer 100 has a dielectric interlayer 120, e.g. in the form of a silicon oxide layer. The interlayer 120 insulates the circuits 110 from the silicon wafer 100.

Furthermore, on its functional side 101, the semiconductor wafer 100 has contact surfaces or contact pads 130, the functional side 101 being defined by the fact that the circuits 110 are arranged thereon. The contact pads 130 are electrically connected (not shown) to the circuits 110. That side of the semiconductor wafer 100 which is the opposite side from the functional side is referred to as back surface 102.

Then, a covering substrate or a covering wafer 200, in this example a Borofloat-33 glass wafer 200, is adhesively bonded onto the semiconductor wafer 100. It is particularly advantageous to use Borofloat-33 glass, since the coefficient of thermal expansion is matched to that of the semiconductor wafer 100.

The two wafers 100 and 200 are joined by means of a layer of adhesive 210, e.g. an epoxy or acrylate adhesive. This results in the quasi-hermetic packaging of the circuits 110.

As an alternative to the layer of adhesive 210, it is also possible to apply a layer of glass, in particular by evaporation coating, so that the base substrate is suitable for anodic or what is known as direct bonding. In this case, therefore, the two wafers are anodically or directly bonded.

After the joining operation, in a first step the semiconductor wafer 100 is thinned uniformly over the entire wafer, for example by mechanical grinding down to a thickness $d_1$. This is possible since the covering wafer 200 imparts the required stability to the assembly.

In a second step following the uniform thinning or grinding of the semiconductor wafer 100, the semiconductor wafer 100 is patterned in such a manner that, on the one hand, contact-connection recesses or contact-connection passages 301 are produced over the contact pads 130 and, on the other hand, connection regions 300 which laterally adjoin the contact-connection passages 301 are produced. This can be carried out in a single step or in two separate steps. It is preferable for this patterning to be carried out by means of a lithographic wet-etching process or a plasma etching process.

The contact-connection passages 301 will extend from the back surface 102 transversely through the semiconductor wafer 100 as far as directly to the contact pads 130.

The wafer is therefore divided into a multiplicity of body regions 104 and connection regions 300, the connection regions 300 being thinned to a greater extent than the body regions 104. In other words, the wafer material 100 is thinned to a thickness $d_2$ in the connection regions 300, $d_2$ being less than $d_1$. In this example, $d_2$ is not equal to zero.

In other words, after the uniform thinning of the semiconductor wafer 100, the wafer material is removed further in the region of the contact-connection passages 301, until the thickness $d_2$ has been reached.

Furthermore, the semiconductor wafer 100 also has a sawing street or a sawing trench 302 which extends laterally into the plane of the drawing and along which the wafer assembly 100, 200 is subsequently diced.

After the contact-connection passages 301 have been produced or etched and the connection regions 300 have been thinned, the back surface of the semiconductor wafer 100 is coated with a passivation layer 400, inter alia in order to protect the sensitive interfaces, e.g. between the semiconductor wafer 100 and the dielectric interlayer 120. The passivation layer 400 is, for example, a layer of evaporation-coating glass. The passivation layer 400 may also be in multilayer form (not shown in FIG. 1). Furthermore, the passivation layer 400, in particular if an evaporation-coating glass is used, also increases the hermetic sealing of the assembly.

The contact-connection passages 301 and the sawing streets or sawing trenches 302 have inclined side walls 303 and 304 in order to ensure a continuous passivation layer 400.

At the same time or in a separate step, the dielectric interlayer 120 which is present in this example and the passivation layer 400 are removed in patterned form over the contact pads 130 in order to uncover the latter for contact-connection from the back surface 102.

Then, a contact redistribution element, more specifically a contact redistribution layer 410 in the form of a metallization, e.g. electro-plated Cu based on Ti/W/Cu plating, is applied on the back surface, extending at least from the contact surface 130 to a secondary contact surface 132 in the connection region 300. Accordingly, the contact redistribution layer 410 extends as far as into the connection region 300, where it forms the secondary contact surface 132. In other words, the contact redistribution layer 410 provides the secondary contact surface 132 in the connection region 300, and this secondary contact surface 132 is arranged laterally offset with respect to the contact pads 130 on the back surface of the semiconductor wafer 100. In this way, the secondary contact surface 132 is advantageously thermo-mechanically decoupled from the functional region (circuit 110).

The secondary contact surface 132 is also coated on the back surface with a bonding layer or gold layer 420, an oxidation-resistant layer and/or a diffusion barrier.

Then, the wafer assembly 100, 200 is sawn, i.e. diced into chips 10, along the sawing streets 302 or along a centre line 600.

Figure 2:
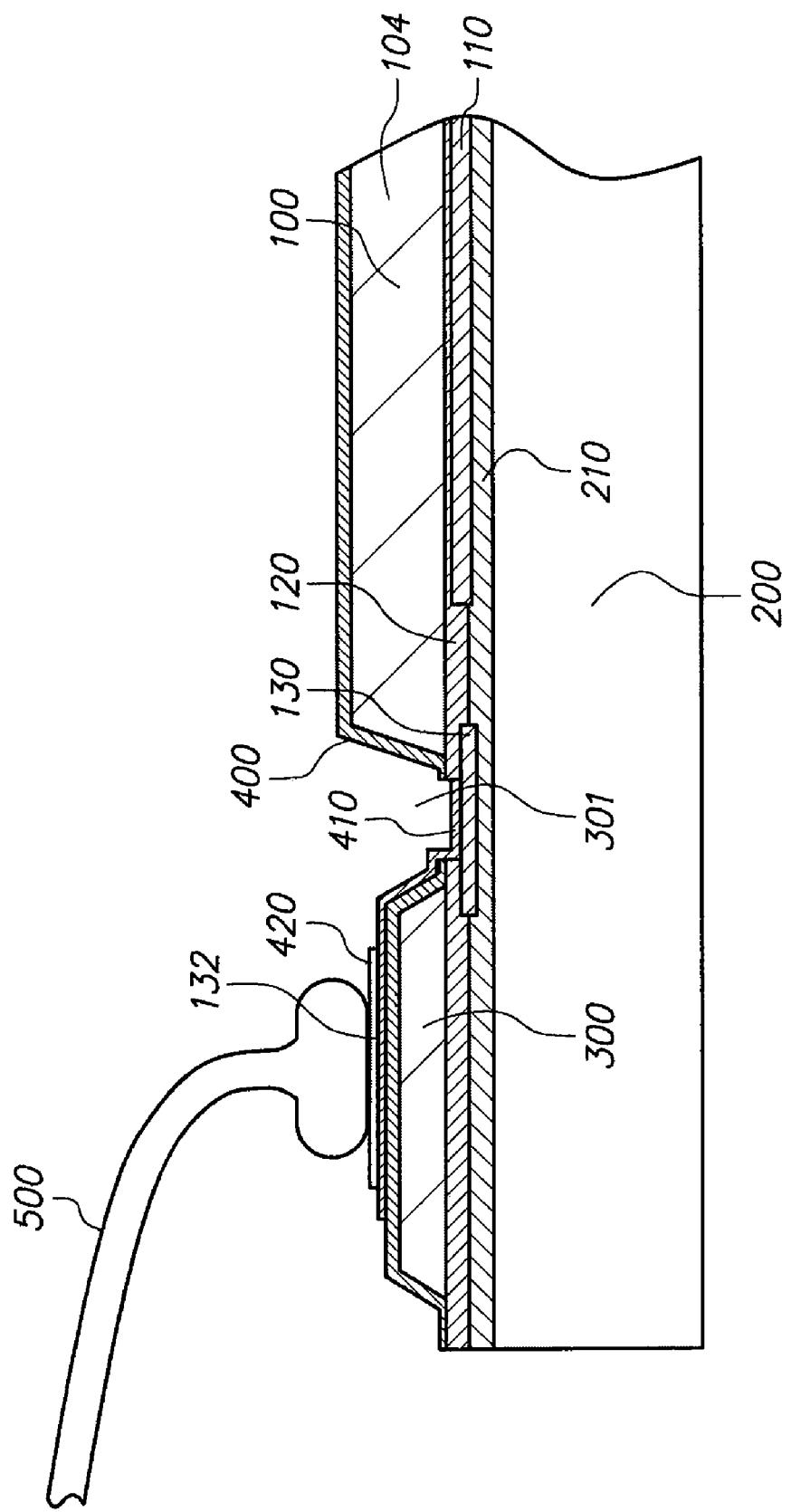
FIG. 2 shows a diagrammatic cross section through the component from FIG. 1 after dicing and wire bonding.

FIG. 2 illustrates a diced chip with a functional region (circuit 110) which has been packaged in a hermetically sealed manner. After dicing, the chips 10 (FIG. 6) are processed further by means of wire bonding 500, for example to a circuit carrier (not shown).

Figure 3:
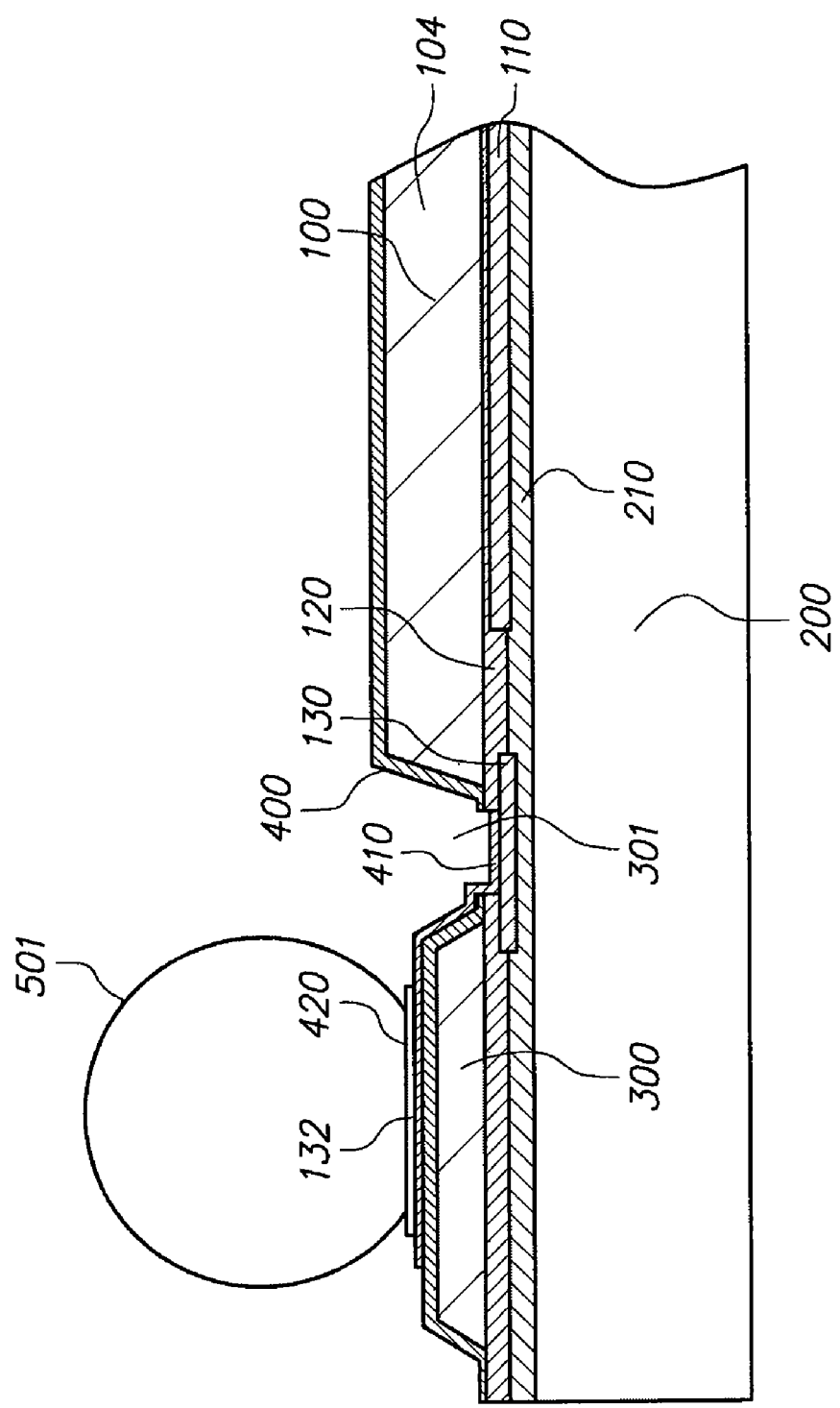
FIG. 3 shows a diagrammatic cross section through an excerpt from an embodiment of the component according to the invention with a solder ball.

Referring now to FIG. 3, a chip 10 is provided with a solder ball 501, which embodies an alternative contact-connection means to the circuit carrier. The solder balls 501 can be applied before or after dicing.

Figure 4:
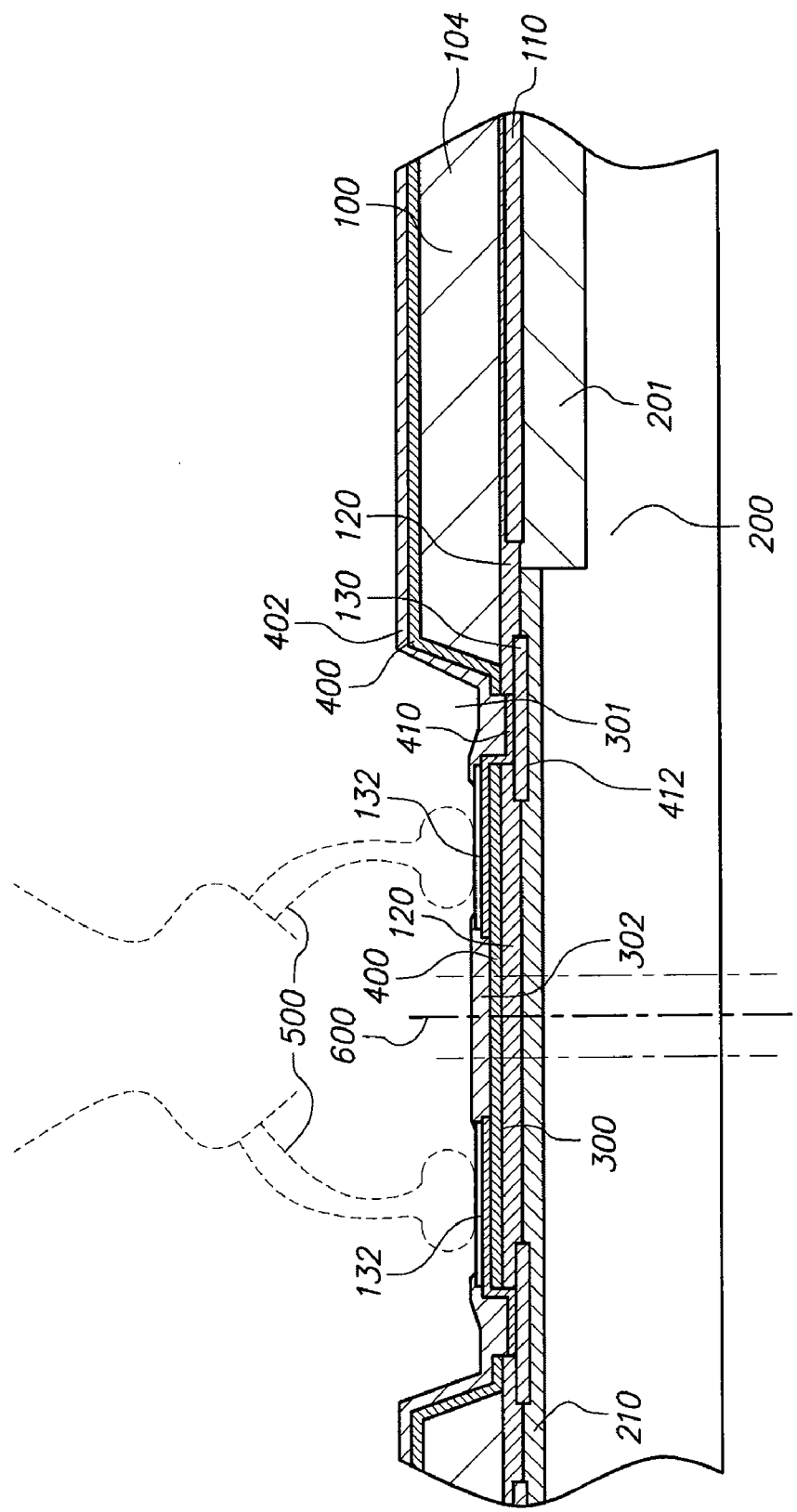
FIG. 4 shows a diagrammatic cross section through an excerpt from a further embodiment of the component according to the invention at wafer level.

FIG. 4 shows the component at wafer level; in this embodiment, the semiconductor wafer 100, in the connection region 300, has been thinned all the way to the dielectric interlayer 120, i.e. down to a thickness of virtually zero. Therefore, the semiconductor material of the wafer 100 has been completely removed in the connection region 300. Therefore, the passivation layer 400, in the connection region 300, is applied direct to the dielectric interlayer 120.

In this example, therefore, the contact-connection passages 301, the connection regions 300 and the sawing streets 302 fuse together to a certain extent to form a common recess in the back surface of the semiconductor wafer 100.

The wire bondings 500 which are to be applied after dicing are indicated by dotted lines.

Furthermore, a second passivation layer 402, in particular made from the same material as the first passivation layer 400, has been applied to the first passivation layer 400. The second passivation layer 402 extends at least over that portion 412 of the contact redistribution layer 410 which is connected to the contact surfaces 130, and in this example extends over the sawing streets 302 in order also to passivate the latter. In other words, a continuous second passivation layer 402 is applied but remains clear or is uncovered over the secondary contact surfaces 132. A recess in the covering substrate 200 defines a cavity 201.

Figure 5:
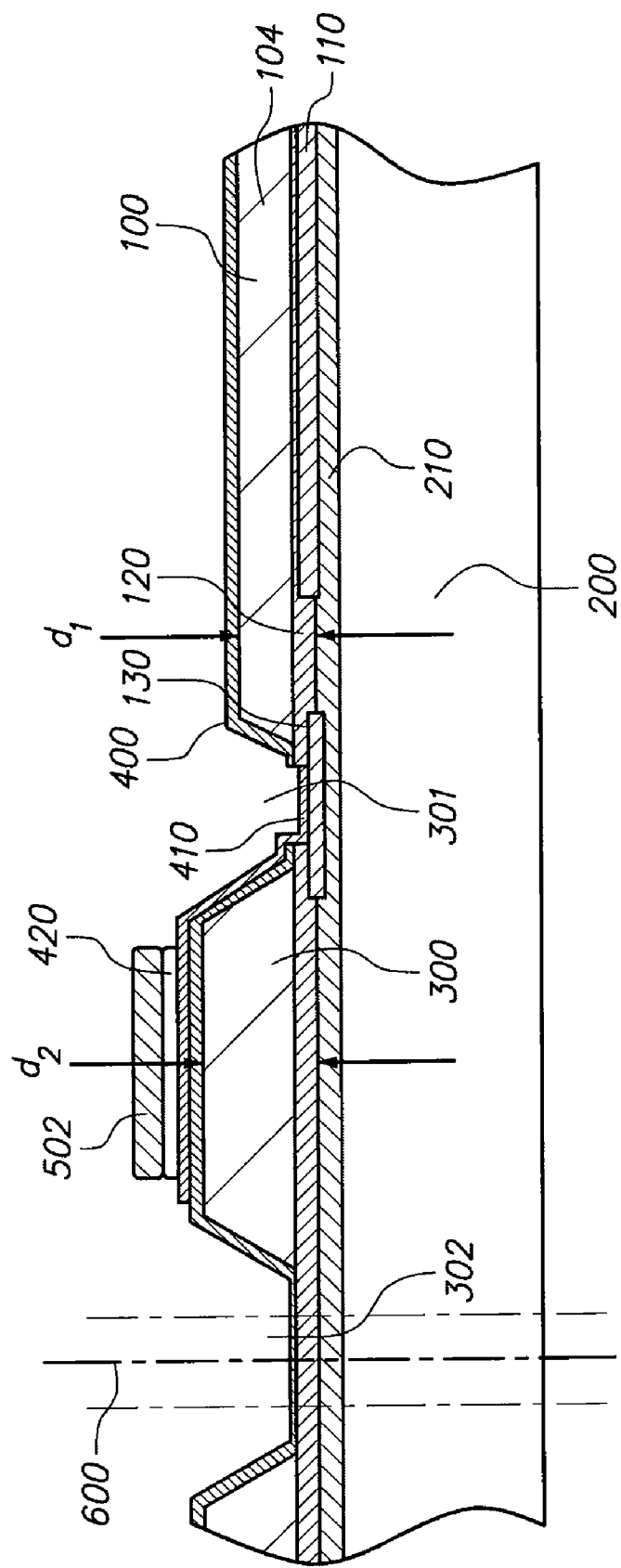
FIG. 5 shows a diagrammatic cross section through an excerpt of a further embodiment of the component according to the invention with a contact element provided with a metal layer.

FIG. 5 shows a wafer assembly in which the thickness $d_2$ of the base substrate 100 is greater in the connection region than in the body region 104. For this purpose, the semiconductor wafer 100 is first of all ground down uniformly to a thickness $d_2$ and is then thinned further in patterned form in the body region 104, so that the thickness of the semiconductor wafer 100 is greater in the connection region 300 than in the body region 104.

With regard to the further process steps, reference is made to FIG. 1.

The bonding layer or gold layer 420 is applied to the connection region 300, which represents the thickest part of the wafer assembly, and then a solder contact 502 is applied to the bonding layer or gold layer 420. The solder contact 502 is, if appropriate, likewise coated by electroplating.

Figure 6:
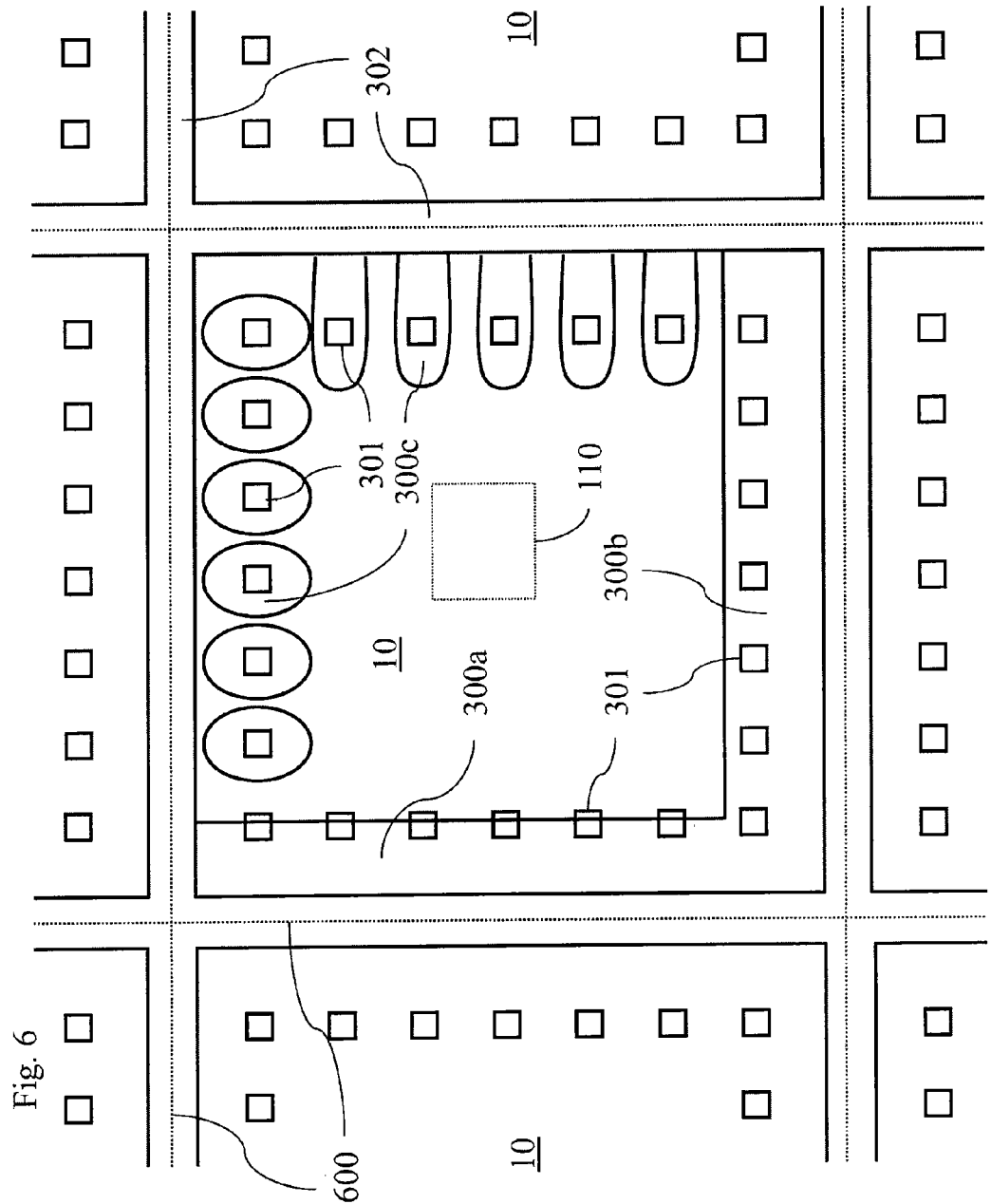
FIG. 6 shows a diagrammatic plan view of an embodiment of the component according to the invention at wafer level.

FIG. 6 shows the wafer assembly 100, 200 together with the contact-connection passages 301. Various forms of connection sections 300a, 300b, 300c are also illustrated.

The connection regions 300a form a common connection strip which extends longitudinally along the sawing trench 302 over the entire chip 10. Furthermore, the connection strip extends transversely with respect to its longitudinal axis, from the centre line 600 of the sawing trench to over the contact-connection passages 301, which are only partially covered.

The connection regions 300b are likewise combined to form a connection strip which, however, extends transversely with respect to its longitudinal axis, completely over the contact-connection passages 301.

Alternatively, a third variant of connection regions 300c is also provided, these connection regions in each case extending separately from one another around the contact-connection passages 301, with each contact-connection passage 301 being assigned a dedicated connection region 300c. In any case, a thinned region is provided around the contact-connection passages 301.

It will be clear to the person skilled in the art that the embodiments described above are to be understood as examples and that the invention is not restricted to these particular examples, but rather can be varied in numerous ways without departing from the scope of the invention.

What is claimed is:

1. A process for packaging components on a wafer comprising a base substrate having a functional side, on which a functional region of a packaged component is arranged, comprising:

- prior to grinding or etching a back surface, bonding a covering substrate to a functional side of the wafer, wherein bonding comprises a single step of gluing, bonding, or adhesively attaching;
- uniformly grinding or etching the back surface of the base substrate to a first thickness comprising a reduced component thickness; and
- further thinning the back surface of the base substrate in a body region and/or a connection region using a lithographic process to provide different thicknesses between the body region and the connection region,
- wherein the further thinning process exposes a contact on the functional side of the wafer; and wherein the contact may be electrically connected to contact surfaces on the connection regions.

2. A process comprising:

in order, a) processing a wafer to form on a functional side of the wafer one or more functional regions, wherein each functional region has at least one electrical contact, the side of the wafer opposite the functional side comprising a back side of the wafer;

b) bonding a covering substrate to the functional side of the wafer, c) uniformly thinning the back side of the wafer to a first thickness;

d) selectively thinning the uniformly thinned back side of the wafer in regions corresponding to the one or more functional regions to provide different thicknesses between a body region and a connection region in each corresponding region;

e) further thinning the back side of the wafer to expose the at least one contact on the functional side of the wafer of each functional region;

f) forming an electrical connection between the exposed contact of a functional region and its corresponding connection region; and g) dicing the wafer to separate each functional region into one or more components.

3. The process according to claim 2 wherein the bonding step b) comprises gluing, bonding or adhesively attaching the covering substrate to the wafer on its functional side.

4. The process according to claim 2 wherein the selective thinning step d) comprises a lithographic process.

5. The process according to claim 2 wherein the further thinning step e) comprises a lithographic process.

6. The process according to claim 2 wherein the uniform thinning step c) comprises grinding or etching.

* * * * *